United States Patent [19]

Takanashi et al.

[11] Patent Number: 5,144,443
[45] Date of Patent: Sep. 1, 1992

[54] APPARATUS FOR REPRODUCING CHARGE LATENT IMAGE WITH VIBRATION OF ELECTRODE TO MODULATE FIELD GENERATED BY IMAGE THEREBY ELECTRO-OPTICALLY MODULATING A READING LIGHT

[75] Inventors: Itsuo Takanashi, Kamakura; Shintaro Nakagaki, Fujisawa; Hirohiko Shinonaga; Tsutou Asakura, both of Yokohama; Masato Furuya, Yokosuka; Tetsuji Suzuki, Yokosuka, all of Japan

[73] Assignee: Victor Company of Japan, Ltd., Yokohama, Japan

[21] Appl. No.: 505,240

[22] Filed: Apr. 4, 1990

[30] Foreign Application Priority Data

Apr. 6, 1989 [JP] Japan ................................. 1-87247

[51] Int. Cl.⁵ .................... H04N 1/21; H04N 3/10; G02F 1/135
[52] U.S. Cl. .................... 358/209; 358/225; 358/471; 358/909; 359/254; 359/255; 359/72; 359/87; 365/108; 365/112
[58] Field of Search .................... 358/209, 213.13, 225, 358/41, 55, 471, 909; 359/72, 87, 245, 246, 252, 254, 255; 365/112, 108

[56] References Cited

U.S. PATENT DOCUMENTS

| | | |
|---|---|---|
| 3,723,651 | 3/1973 | Gorog . |
| 3,769,512 | 10/1973 | Grenot . |
| 3,932,025 | 1/1976 | Lakatos . |
| 3,957,349 | 5/1976 | Nelson . |
| 4,831,452 | 5/1989 | Takanashi . |
| 4,945,423 | 7/1990 | Takanashi . |
| 4,956,713 | 9/1990 | Takanashi . |
| 4,956,714 | 9/1990 | Takanashi . |
| 4,975,776 | 12/1990 | Takanashi . |
| 4,988,876 | 1/1991 | Doughty . |
| 5,006,935 | 4/1991 | Takanashi . |
| 5,027,216 | 6/1991 | Takanashi . |

FOREIGN PATENT DOCUMENTS 222924 9/1990 Japan .

Primary Examiner—George H. Miller, Jr.
Assistant Examiner—Scott A. Rogers
Attorney, Agent, or Firm—Michael N. Meller

[57] ABSTRACT

There is provided an apparatus for reproducing a charge latent image prerecorded on a recording medium composed of at least a photo-modulation layer and a charge holding layer laminated thereto and holding said charge latent image. The apparatus has two electrodes interposing the recording medium therebetween. The electrodes are connected to each other and one of which is spaced from the recording medium. A reading light is allowed to permeate the photo-modulation layer. The apparatus also has a vibrator which vibrates one of the electrodes to modulate an electric field generated between the electrodes by the charge latent image prerecorded on the recording medium. The reading light is then electro-optically modulated to reproduce the charge latent image.

6 Claims, 11 Drawing Sheets

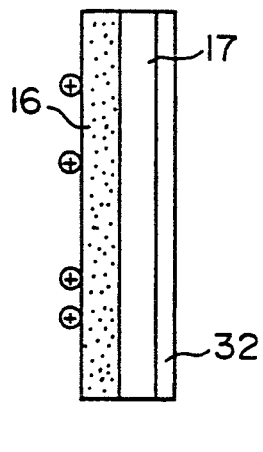 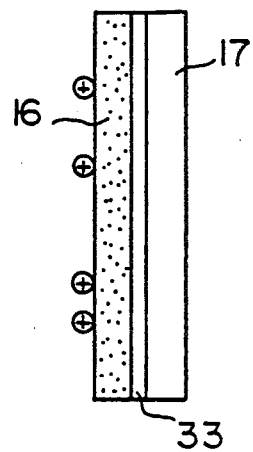 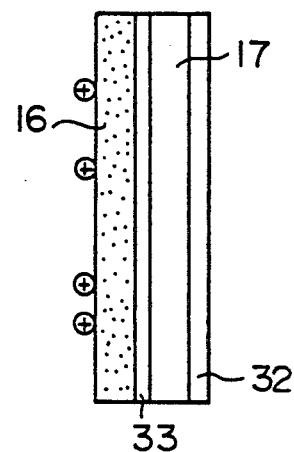
FIG.7     FIG.8     FIG.9
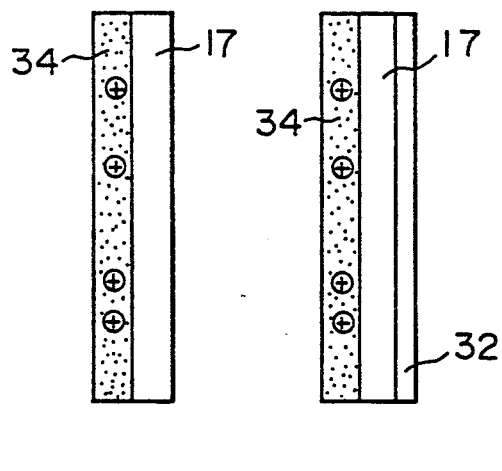 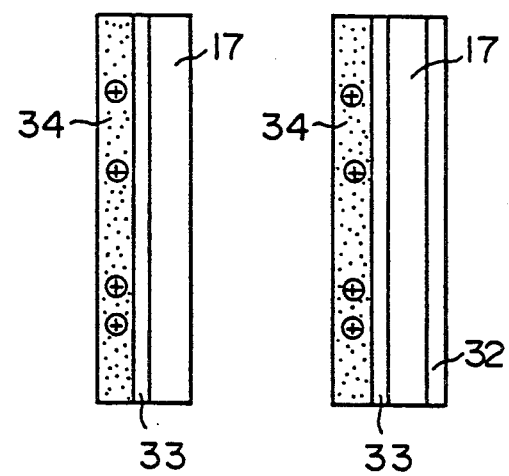
FIG.10   FIG.11   FIG.12   FIG.13

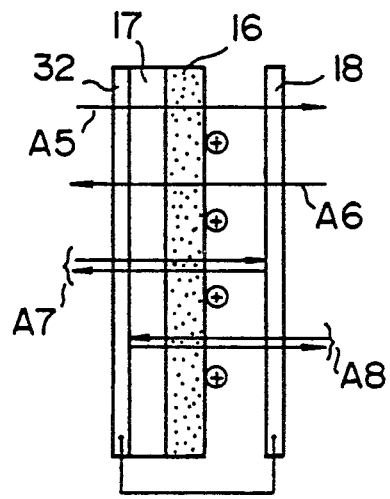
FIG. 18
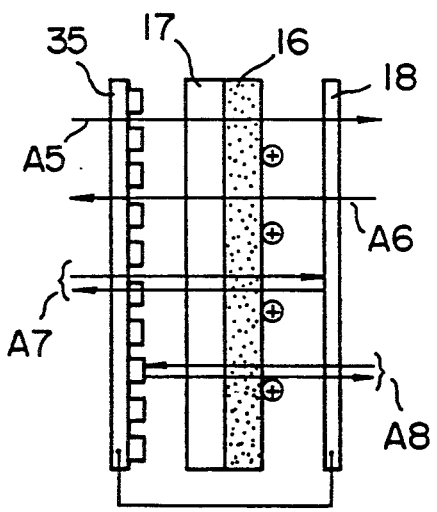 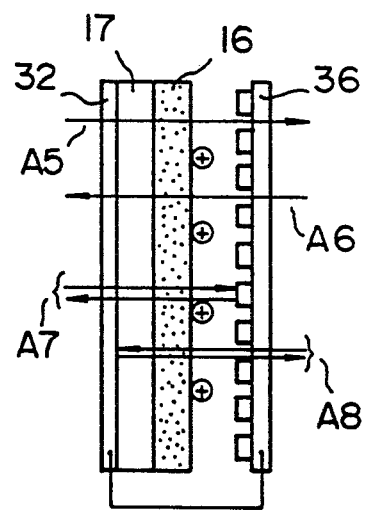
FIG. 19  FIG. 20

APPARATUS FOR REPRODUCING CHARGE LATENT IMAGE WITH VIBRATION OF ELECTRODE TO MODULATE FIELD GENERATED BY IMAGE THEREBY ELECTRO-OPTICALLY MODULATING A READING LIGHT

BACKGROUND OF THE INVENTION

This invention relates to an apparatus for reproducing information which has been recorded as a charge latent image.

There is a conventional apparatus for recording/reproducing information such as a graphic image in the form of a charge latent image as shown in FIGS. 1 and 2. FIGS. 1 and 2 depict a recording system and a reproducing system, respectively.

Throughout the drawings, like reference numerals and letters are used to designate like or equivalent elements for the sake of simplicity of explanation.

First, the recording system will be explained with reference to FIG. 1. In FIG. 1, a recording medium 1 on which a charge latent image is intended to be recorded is composed of a charge holding layer 2 and an electrode 3. A photoelectric recording head 4 is composed of a photoconductive layer 5 and a transparent electrode 6.

The recording medium 1 and the photoelectric recording head 4 are arranged such that the charge holding layer 2 and the photoconductive layer 5 face each other across a predetermined space. The light carrying the optical image of an object O is allowed to be incident to the transparent electrode 6 of the photoelectric recording head 4 through an imaging lens 7, as depicted by an arrow A1.

A d.c. voltage source 9 is connected across the electrodes 3 and 6 through a switch 8. There will be a discharge generated across the charge holding layer 2 and the photoconductive layer 5 by turning on the switch 8.

In the configuration, the charge holding layer 2 is to hold charges for a long period of time and is formed of the material having extremely high insulation resistance, such as silicon resin. While, the photoconductive layer 5 is to generate pairs of an electron and a hole and is formed of such as amolphous silicon. In FIG. 1, the electrons are transferred to the transparent electrode 6 side in the photoconductive layer 5, on the other hand, the holes to the side in the layer 5, facing the charge holding layer 2. The electrodes 3 and 6 are formed of a material such as ITO (Indium Tin Oxide).

The recording operation of the recording system constituted as above will be explained. As is depicted by the arrow A1, the light carrying the optical image of the object O is incident to the imaging lens 7 as depicted by the arrow A1 and is further incident to the photoconductive layer 5 of the photoelectric recording head 4, through the imaging lens 7 and the transparent electrode 6. The light is then absorbed in the photoconductive layer 5 to generate the electron-hole pairs therein.

Now the switch 8 is turned on to allow the voltage source 9 to apply a voltage across the electrodes 3 and 6. This causes the electrons in the photoconductive layer 5 being attracted by the positive polarity of the voltage source 9 to be transferred to the transparent electrode 6 side, while the holes to the side of the layer 5, facing the charge holding layer 2, as described above. The holes or the positive charge image corresponding to the optical image of the object O are therefore formed on the surface of the photoconductive layer 5, facing the charge holding layer 2.

Furthermore, there is a discharge generated across the photoconductive layer 5 and the charge holding layer 2 due to the voltage applied by the voltage source 9. This discharge causes electrification on the surface of the charge holding layer 2 facing the phoroconductive layer 5, so that charges Q are stored thereon.

The electrification due to the discharge depends on the distribution of the holes or the positive charge image on the surface of the photoconductive layer 5. The charge latent image corresponding to the optical image of the object O is thus transferred to the surface of the charge holding layer 2. Since the switch 9 causes the formation of the charge latent image, the switch 9 may be applied to a shutter of a camera.

Next, the reproducing system will be explained with reference to FIG. 2. In FIG. 2, there is arranged an optical reproducing head 10 facing the recording medium 1 on which the charge latent image has been recorded. The optical reproducing head 10 is composed of a photo-modulation layer 11 and a transparent electrode 12. The surface of the photo-modulation layer 11 faces the charge holding layer 2 of the recording medium 1, in the configuration. An optical reading unit 13 is further arranged to emit a reading light to the transparent electrode 12 of the optical reproducing head 10 as depicted by an arrow A2. The reading light passing the optical reproducing head 10 and the recording medium 1 is allowed to be incident to a photo-detection unit 14 as depicted by an arrow A3.

In the configuration, a photo-modulation layer 11 of the optical reproducing head 10 is formed of a material such as $LiNbO_3$, BSO ($Bi_{12}SiO_{20}$), liquid crystal, PLZT (Lead lanthanum zirconate titanate) or EC (Electrochromic), having photoelectric effect that light is varied accordingly with electric field. The photoelectric effect may be a double reflection effect, scattering effect or colouring effect. Selection of the material thus depends on the purpose. The optical reading unit 13 is composed of a laser light source, an analyzer, etc. (not shown), to generate the light for reading the charge latent image. The photo-detection unit 14 is further composed of a wave-plate, an analyzer, a photoelectric convertor, etc. (not shown), to detect the light incident thereto.

The operation of the reproducing system will be explained. The charge latent image corresponding to the object O has already been recorded on the recording medium 1 as described with reference to FIG. 1. The optical reproducing head 10 is arranged adjacent to the recording medium 1 and the transparent electrodes 3 and 12 are electrically connected to each other. Under the configuration, electric field due to the latent charges Q will affect the photo-modulation layer 11 to cause an electro-optic effect in the incident light.

Now the optical reading unit 13 emits the reading light to the optical reproducing head 10 to force the photo-modulation layer 11 to cause the electro-optic effect. The phase of the light emitted to the photo-modulation layer 11 and that of the light subjected to the electro-optic effect therein are therefore varied with respect to each other.

The reading light subjected to the electro-optic effect passes the recording medium 1 and is incident to the photo-detection unit 14. The intensity distribution of the reading light is varied accordingly with the distribution of the latent charges Q by the analyzer (not shown)

and is converted to electric signals. As a result, the electric signals corresponding to the optical image of the object O are generated.

In the case of colour image photographing, the light from the object O is divided into primary colours by means of a proper optical equipment, to be recorded, reproduced and combined each other.

The conventional charge latent image recording/reproducing apparatus as described above has drawback that the intensity of the electric field due to the charge latent image, which affects the photo-modulation layer is gradually reduced as time lapses, because of the finite impedance of the photo-modulation layer of the reproducing system. This results in the reduction of gain, resolution, etc. during the reproduction.

SUMMARY OF THE INVENTION

An object of the present invention is to provide an apparatus for reproducing a charge latent image, without the lapsed reduction of gain, resolution, etc. during the reproduction.

There is provided an apparatus for reproducing a charge latent image prerecorded on a recoding medium composed of at least a photo-modulation layer and a charge holding layer laminated thereto and holding the charge latent image.

The apparatus comprises two electrodes interposing the recording medium therebetween. The two electrodes are connected to each other and one of which is spaced from the recording medium. A reading light is allowed to permeate the photo-modulation layer.

The apparatus also comprises a vibrator which vibrates one of the two electrodes to modulate an electric field generated between the two electrodes by the charge latent image prerecorded on the recording medium. The reading light is then electro-optically modulated to reproduce the charge latent image.

BRIEF DESCRIPTION OF THE DRAWINGS

FIGS. 7 to 24 show variations of the first embodiment;

DETAILED DESCRIPTION OF THE PREFERRED EMBODIMENTS

The preferred embodiments of the present invention will be explained in detail, with reference to the accompanying drawings.

Figure 1:
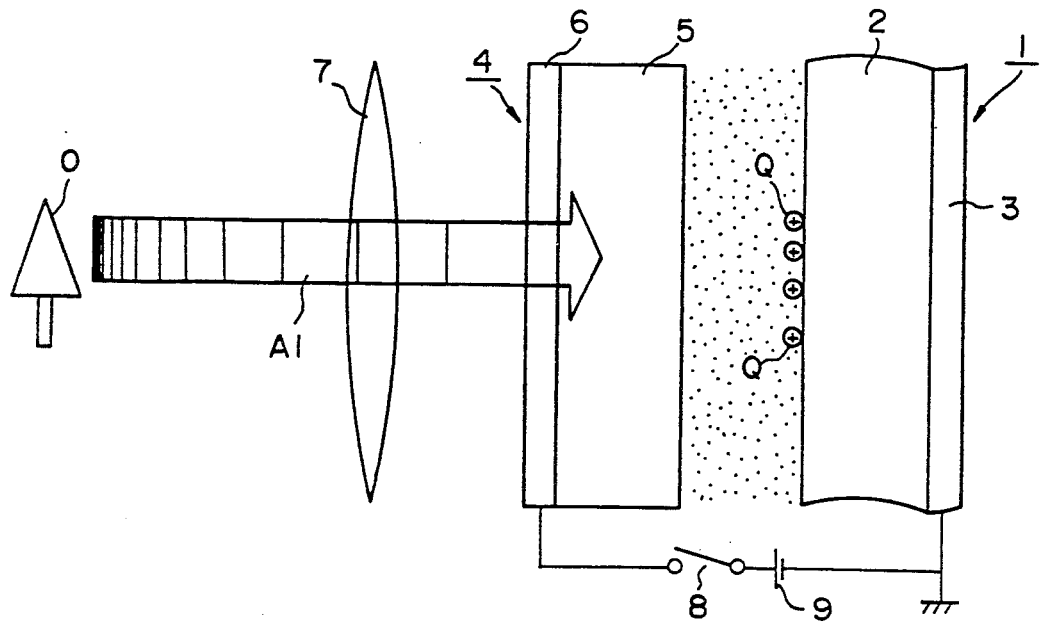
FIG. 1 is an explanatory view of the recording system of a conventional charge latent image recording/reproducing apparatus.
Figure 2:
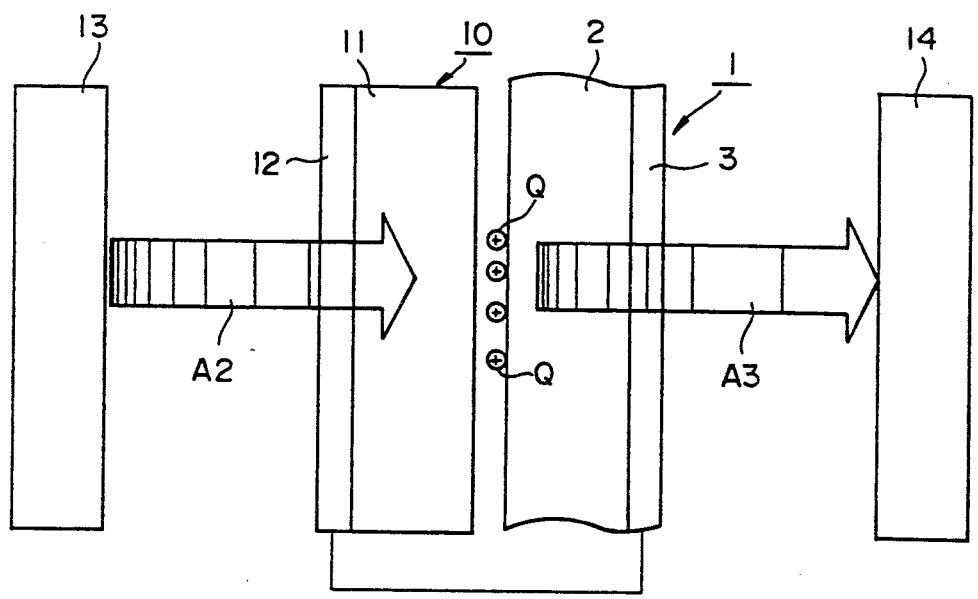
FIG. 2 is an explantory view of the reproducing system of the conventional charge latent image recording/reproducing apparatus.
Figure 3:
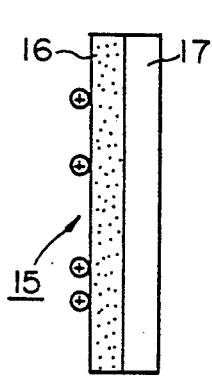
FIGS. 3 to 5 are explantory views of the first preferred embodiment of the charge latent image reproducing apparatus of the present invention.

The first embodiment of the present invention will be explained with reference to FIGS. 3 to 6. FIG. 3 shows a recording medium 15 related to the first embodiment.

The recording medium 15 is constituted by laminating a charge holding layer 16 and a photo-modulation layer 17. A charge latent image is conventionally recorded on the recording medium 15.

Figure 4:
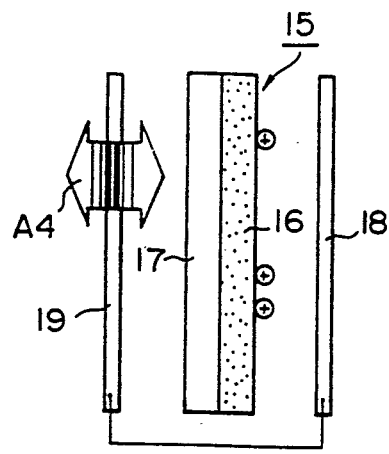

FIG. 4 shows a reproducing system for the recording medium 15. There are electrodes 18 and 19 electrically connected to each other and arranged forward and backward of the recording medium 15 with proper spaces. The electrode 19 is arranged to vibrate substantially perpendicular to the recording medium as depicted by an arrow A4.

Figure 5:
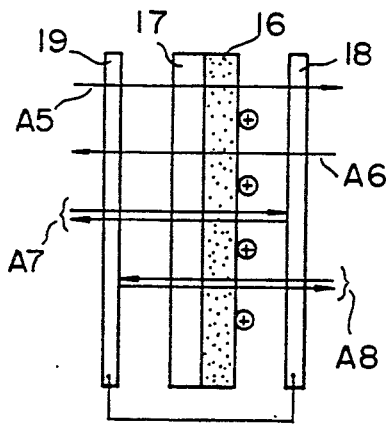

FIG. 5 shows the state of the incident reading light in the reproducing system. Arrows A5 and A6 depict two ways for the reading light to pass through the recording medium as well as the two electrodes 18 and 19. While, arrows A7 and A8 depict two ways for the reading light to be reflected at the electrodes 18 or 19.

Figure 6:
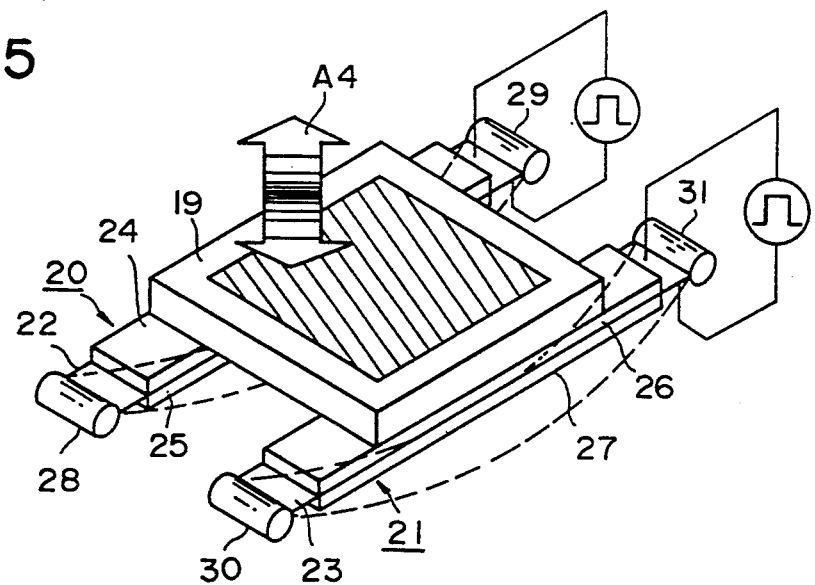
FIG. 6 shows a vibration unit used for the first embodiment.

FIG. 6 shows a vibration unit for the electrode 19. In FIG. 6, the electrode 19 is affixed, at both ends thereof, to piezoelectric resonators 20 and 21, respectively. The piezoelectric resonators 20 and 21 are constituted by providing bimorph-type resonating elements 24 to 27 on the both surfaces of suppoters 22 and 23, respectively. The suppoters 22 and 23 at both ends thereof are affixed to fixing members 28 to 31, respectively. Voltages applied across the resonating elements 24 and 25 and also 26 and 27 cause the piezoelectric resonators 20 and 21 to vibrate as depicted by the dashed and solid lines. This further causes the electrode 19 to vibrate in the directions depicted by the arrow A4.

Next, the operation of the first embodiment will be explained. Firstly, the electrode 19 is vibrated by the vibration unit shown in FIG. 6, in the vertical direction to the surface of the recording medium 15 (the directions depicted by the arrow A4) as shown in FIG. 4. The reading light is then incident to the photo-modulation layer 17 as depicted by either the arrows A5 or A6 in FIG. 5.

The charge latent image corresponding to the object (not shown) has preliminary been recorded as latent charges Q on the charge holding layer 16. The electric field due to the latent charges Q on the surface of the charge holding layer 16 subjects the photo-modulation layer 17 which is laminated to the charge holding layer 16, to cause an electro-optic effect in the incident light.

In this case, the vibrating electrode 19 causes the capacitance across the electrodes 18 and 19 to be varied, whereas the amount of the charges held on the charge holding layer 16 is constant. As a result, an alternating electric field two dimensionally corresponding to the potential distribution of the latent charges Q is applied to the photo-modulation layer 17, to cause the electro-optoc effect in the reading light. This has already been described in detail in Japanese Patent Application No. 1988(63)-334939.

The reading light thus modulated accordingly with the electro-optic effect is then incident to a photo-detection unit (not shown) which in turn converts the modulated light into an intensity modulated light resulting a pattern of intensity distribution corresponding to the preliminary recorded latent charges Q, thus detecting the charge latent image.

Next, the variations of the first embodiment will be explained. Firstly, the variations of the recording medium will be explained with reference to FIGS. 7 to 13. FIG. 7 shows the configuration that an electrode 32 is laminated to the photo-modulation layer 17 of the recording medium 15 in FIG. 3. An aluminum film to reflect light, An ITO film through which light passes, etc. may be selected as the electrode 32, according to the nature of the incident reading light.

FIGS. 8 and 9 show other configurations that a dielectric mirror 33 which reflects the reading light is disposed between the charge holding layer 16 and the photo-modulation layer 17 in the configurations in FIGS. 3 and 7, respectively.

FIGS. 10 to 13 show further configurations that a charge holding layer 34 which holds charges inside thereof is provided, instead of the charge holding layer 16 on which charges are held, in the configurations in FIGS. 3 and 7 to 9.

Figure 14:
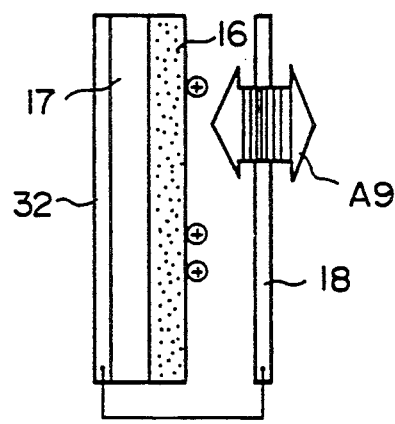

The variations of the electrode vibration will be explained with reference to FIGS. 14 to 17. FIG. 14 shows the configuration that the recording medium shown in FIG. 7 is employed and the electrode 18 vibrates in the directions depicted by an arrow A9.

Figure 15:
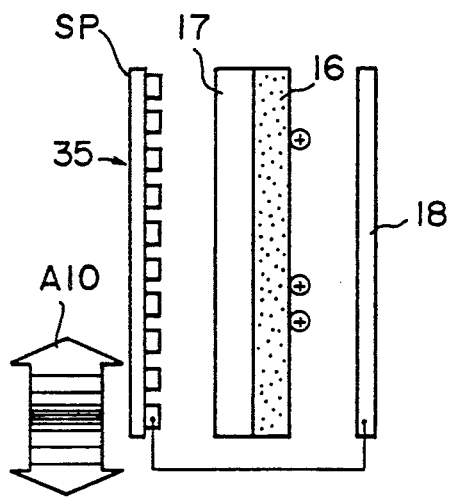
Figure 16:
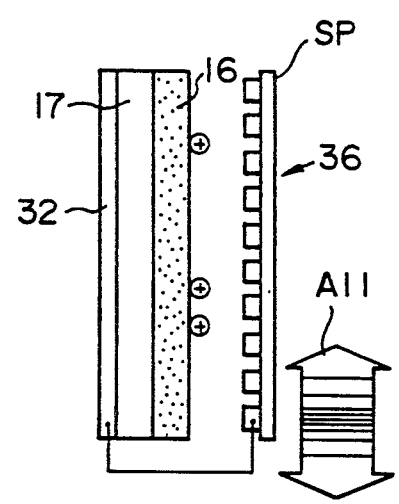
Figure 17:
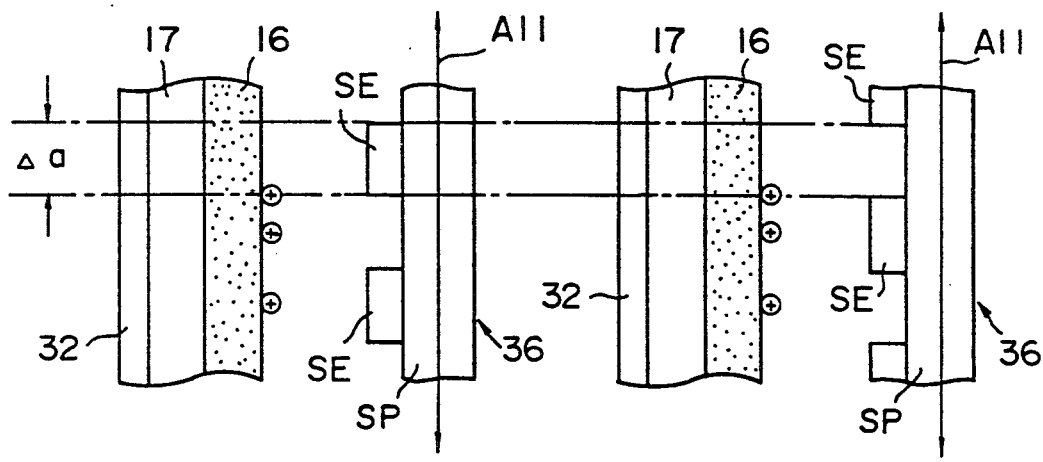
Figure 21:
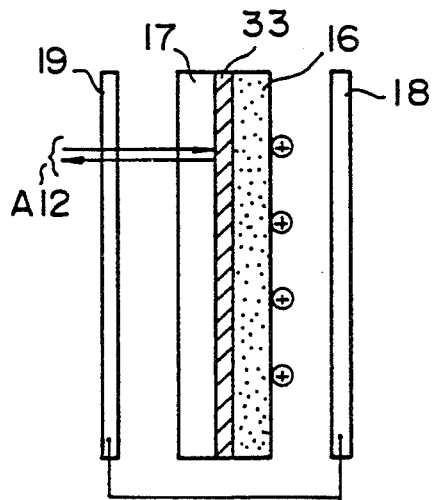
Figure 22:
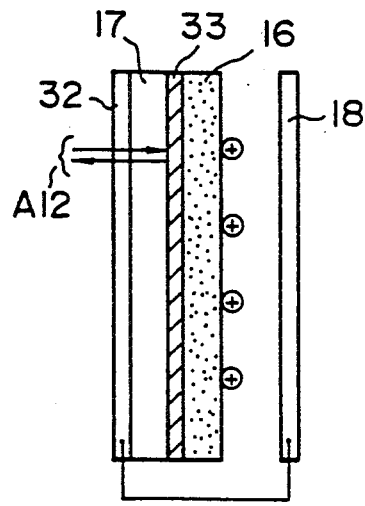
Figure 23:
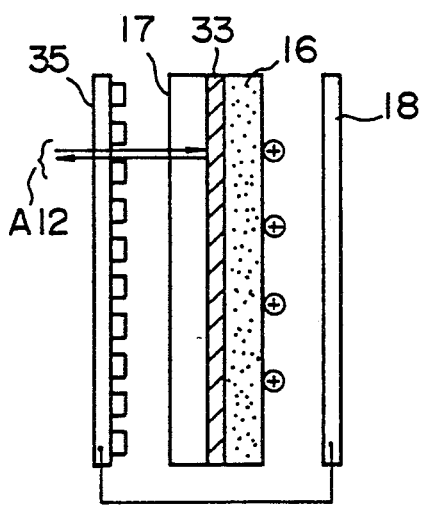
Figure 24:
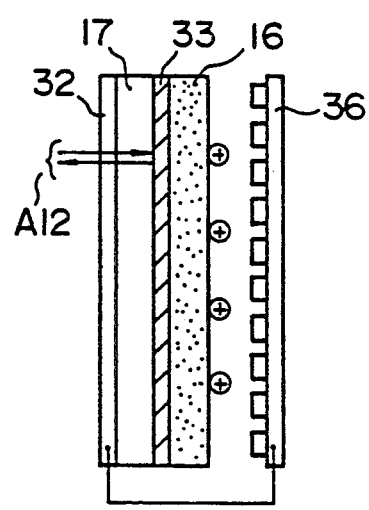

FIGS. 15 and 16 show the configurations that the electrodes 35 and 36 vibrate along the surface of the recording medium in the directions depicted by arrows A10 and A11, instead of the electrodes 19 and 18 in FIGS. 4 and 14, respectively.

Each of the electrodes 35 and 36 is composed of a flat insulative support SP and a plurality of conductive stripe SE spaced with a distance Δa each other and formed on the insulative support SP, extending horizontally to form a striped pattern which confronts the recording medium. When the electrodes 35 or 36 vibrates, each of the stripes SE displaces to go in and out of a space equal to the distance Δa. This causes in effect that each of the conductive stripes SE, when observed from a line of the charges on the charge holding layer 16 in FIG. 17, displaces off and on the line alternately as the electrode 35 or 46 vibtates. As a result, an alternating electric field is gnerated in the photo-modulation layer Next, the variations of the reading light incident to the reproducing system will be explained with reference to FIGS. 5 and 18 to 24. As is shown in FIGS. 18 to 20, in the case of excluding the dielectric mirror 33, the configuration is the same that shown in FIG. 5. Whereas in FIGS. 21 to 24, the dielectric mirror 33 is included, the reading light passes the photo-modulation layer 17 and is reflected at the dielectric mirror 33, as depicted by arrows A12. In this case, the reading light is not optically affected by the charge holding layer 16 so that information recorded as the charge latent image is read out more precisely.

Figure 25:
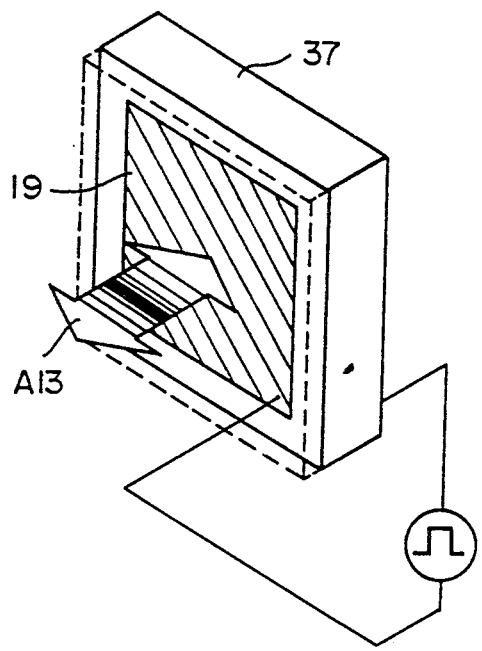
FIGS. 25 to 27 show vibrating units for the variations shown in FIGS. 7 to 24.

The variations of the electrode vibration unit are explained with reference to FIGS. 25 to 27. FIG. 25 shows the configuration that the electrode 19 is formed on a piezoelectric resonator 37. The thickness of the resonator 37 is varied in response to a driving voltage applied thereto. This causes the electrode 19 to vibrate in the thickness directions depicted by an arrow A13.

Figure 26:
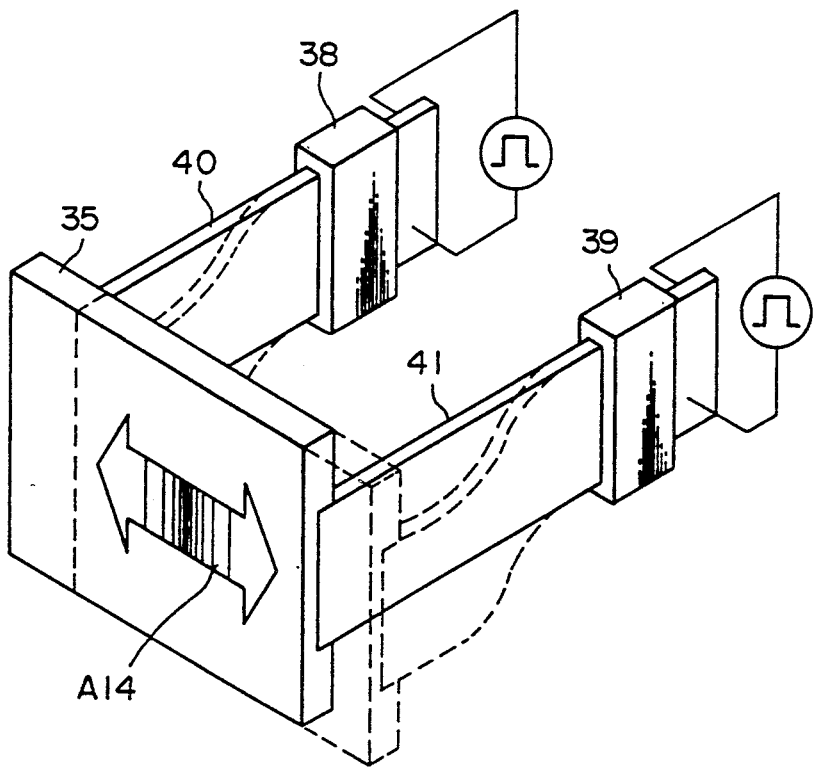

FIG. 26 shows the configuration that the electrode 35 is affixed to the ends of two bimorph-type resonating elements 40 and 41 which are rooted to members 38 and 39, respectively. The electrode 35 vibrates in the lateral directions depicted by an arrow A14 as applying a proper driving voltage thereto.

Figure 27:
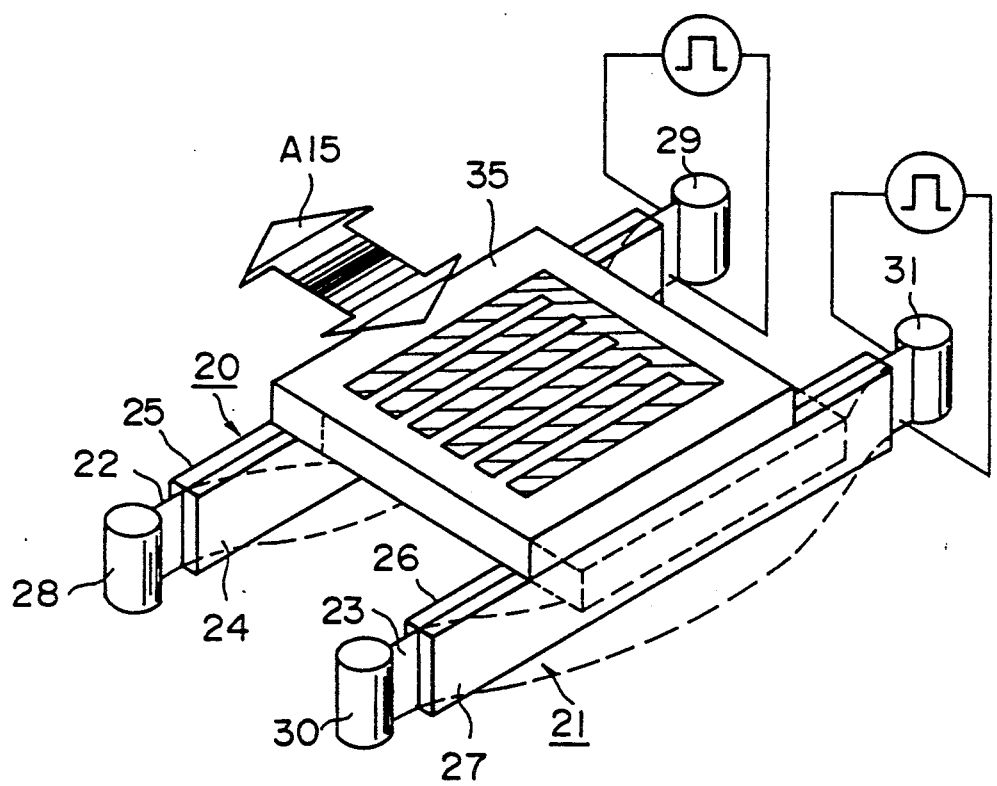

FIG. 27 shows the configuration that the piezoelectric resonators 20 and 21 shown in FIG. 6 are vertically arranged and the electrode 35 is mounted thereon at both ends thereof. The vibration of the resonators 20 and 21 as depicted by the dashed and solid lines causes the electrode 35 to vibrate horizontally as depicted by an arrow A15.

In FIGS. 6 and 27, the piezoelectric resonator may be composed of two pieces of piezoelectric resonating elements or more. Either one of the resonating elements may be replaced with a leaf spring.

As is described above, the photo-modulation layer is laminated to the charge holding layer and the electrode vibrates to generate the alternating electric field applied to the photo-modulation layer, according to the first embodiment and the variations thereof. This enables reading of the charge latent image with high gain and resolution using the photo-modulation layer and the dielectric mirror both with finite impedances.

Figure 28:
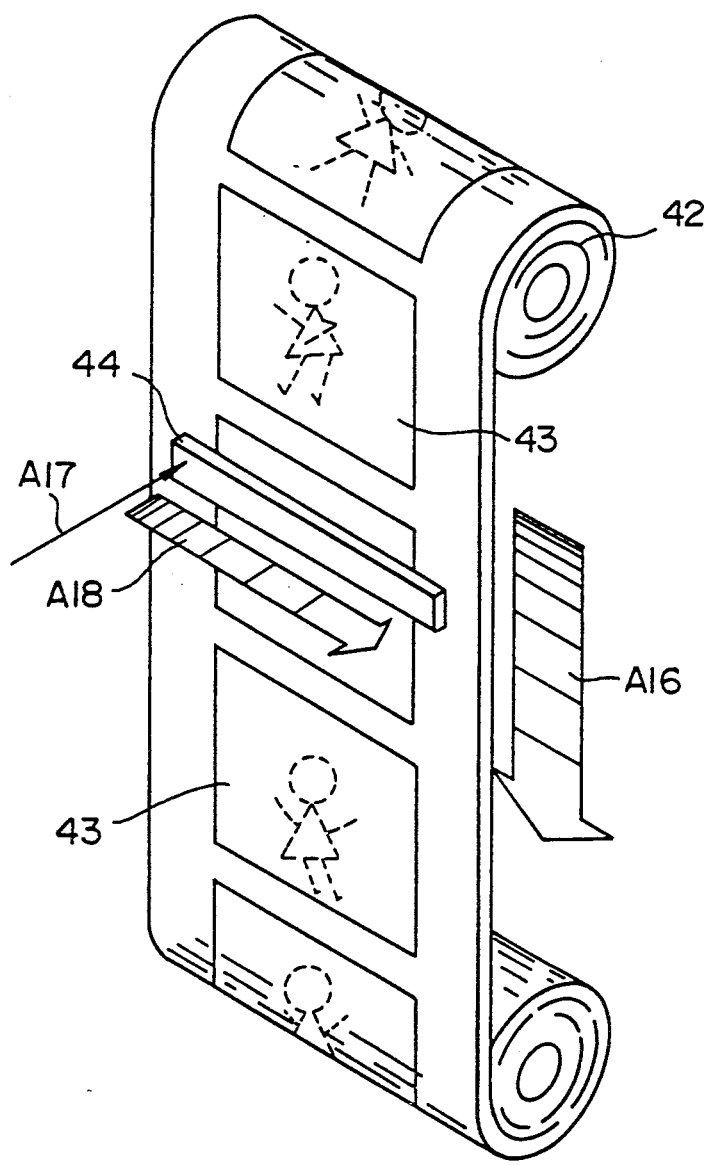
FIG. 28 is an explanatory view of the second preferred embodiment of the charge latent image reproducing apparatus of the present invention.

The second preferred embodiment of the present invention will be explained with reference to FIG. 28. In FIG. 28, a recording medium 42 having at least a charge holding layer on which frames of charge latent images are prerecorded is formed to a tape, like a film for a still camera. Each frame 43 of the charge latent image is arranged to advance vertically in the direction depicted by an arrow A16.

A reproducing head 44 for the recording medium 42 is constituted as a line head capable of one-line (horizontal) reproduction of the charge latent image and is arranged to face and scan vertically the recording medium 42 as the recording medium 42 is transported vertically.

The reading light is allowed to be incident to the reproducing head 44 and to scan horizontally the frame 43 in the direction depicted by an arrow A18. The frame 43 is thus entirely scanned by this scanning and the transport of the recording medium 42 in the direction depicted by the arrow A16.

The operation of the second embodiment will be explained. A constraction of the reproducing head 44 is conventional i.e. the reproducing head in composed to have at least a photo-modulation layer. Every time the reading light scans horizontally the recording medium 42 in the direction depicted by the arrow A18, a corresponding line of the charge latent image is reproduced. Moreover, as the recording medium 42 is transported in the direction depicted by the arrow A16, the charge latent image is successively reproduced line by line. The charge latent image of full frame 43 is thus reproduced. This process is like beam scanning in a television system.

In this arrangement of FIG. 28, the reproducing head 44 faces the charge latent image prerecorded on the recording medium 42 only once at every scan of the reading light. In other words, the reproducing head 44 is subjected by the electric field of the charge latent image only upon the charge latent image is reproduced. This prevents the degradation of the electric field intensity of the charge latent image due to the finite impedance of the photo-modulation layer. Therefore, the reproduction gain and the resolution is improved.

Figure 29:
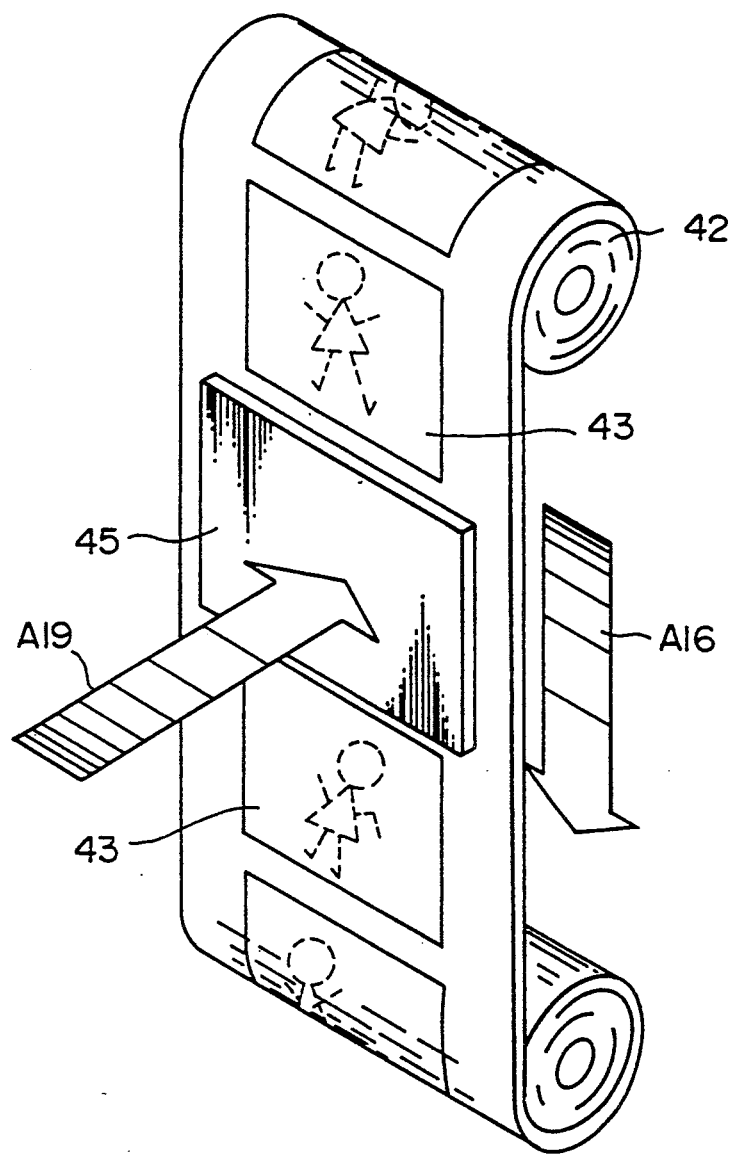
FIGS. 29 and 30 are variations of the second embodiment.

The variations of the second embodiment will be explained with reference to FIGS. 29 and 30. FIG. 29 shows the configuration that a reproducing head 45 is provided, which is capable of reproducing one full frame 43 of the charge latent image at a time, and is composed of at least a photo-modulation layer.

The scanning by the reading light in the direction depicted by the arrow A18 in FIG. 28 is not required in this case. The recording medium 42 is transported frame by frame in the longitudinal direction of the recording medium depicted by the arrow A16. The reading light having a large enough section irradiates the entire surface of the reproducing head 45, upon the instance that the frame 43 and the reproducing head 45 fully confront each other. Or, as an alternative, the reproducing head 45 being irradiated by the reading light is brought into the position to confront the frame 43 for reproduction as the frame 43 is intermittently transported.

Figure 30:
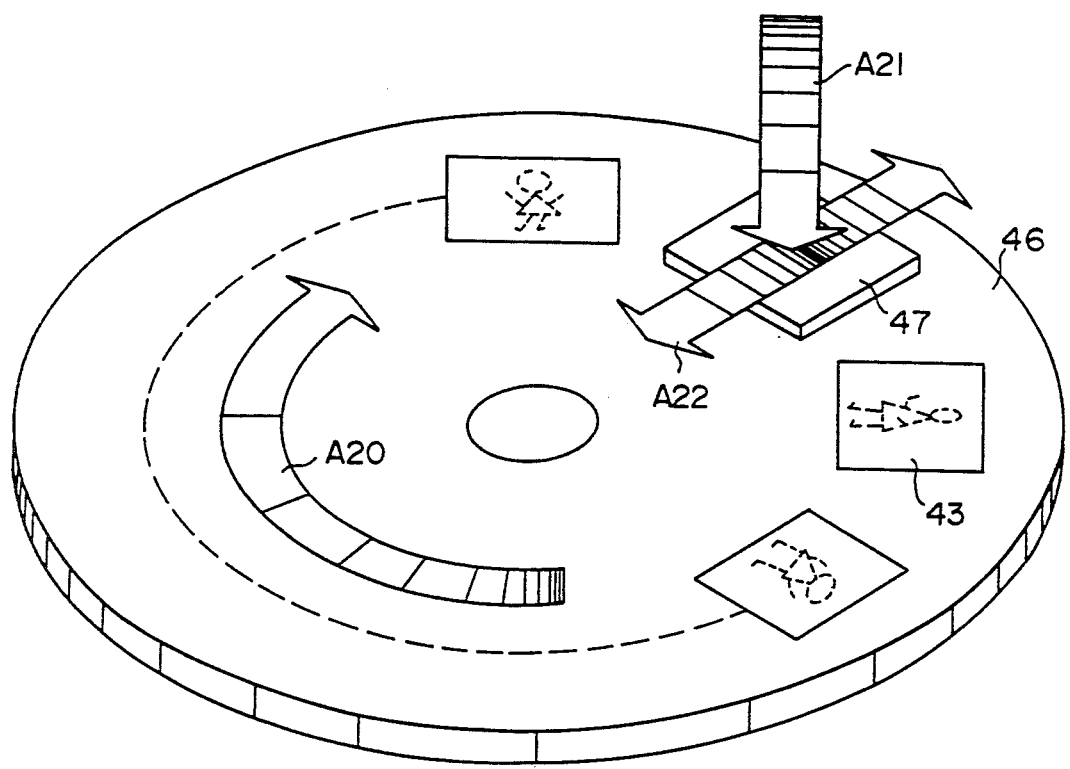

FIG. 30 shows the further embodiment that the present invention is applied to a disk-type recording medium 46 having at least a photo-modulation layer. A reproducing head 47 successively reproduces the charge latent image recorded on a recording medium 46 while rotating in the direction depicted by an arrow A20. The reading light irradiates the entirety of the reproducing head 47 from the top as depicted by an arrow A21 upon the instance that the reproducing head 47 confronts the frame 43 same as in the embodiment of FIG. 29. Or, the recording medium 46 may be rotated intermittently to alight the frame 43 with the recording head 47 which is constantly irradiated by the reading light. A position of the reproducing head 47 is controlled radially as depicted by an arrow A22 to track the frames aligned circumferencially in this embodiment.

As for the recording medium and the reproducing head in the second embodiment and the variations thereof, such devices described in the conventional reproducing apparatus already explained, the first embodiment or U.S. Pat. No. 437,479 may be applied. And the reproducing head may be separated from the recording medium except for performing a reproduction.

As is described in the second embodiment and the variations thereof, the reproducing head having at least a photo-modulation layer is brought to confront the charge latent image intended to be reproduced, upon the instance of the reproduction, and is displaces off the charge latent image right after the reproduction. The adverse effect on the electric field of the latent charges from the photo-modulation layer is thus reduced, so that the direction gain and the resolution of the charge latent image are improved.

The present invention may be practiced or embodied in still other ways without departing from the spirit or essential character thereof. For instance, the polarity of the latent charges can not only be positive but also negative. The information intended to be recorded/reproduced may be voices, data, etc., other than images.

The recording medium may be formed in a card, etc., other than the sheet, the tape, and the disk described in this specification. The medium may further be constituted so as to be flexible or solid.

What is claimed is:

1. An apparatus for reproducing a charge latent image prerecorded on a recording medium composed of at least a photo-modulation layer and a charge holding layer laminated thereto and holding said charge latent image, said apparatus comprising:

two electrodes interposing said recording medium therebetween, said two electrodes connected to each other, one of which is spaced from the recording medium, a reading light permeating said photo-modulation layer; and vibrating means vibrating said one of the two electrodes to modulate an electric field generated between the two electrodes by said charge latent image prerecorded on the recording medium, thereby said reading light is electro-optically modulated to reproduce said charge latent image.

2. An apparatus for reproducing a charge latent image as claimed in claim 1 wherein said vibrating means is composed of, at least, two piezoelectric resonating elements.

3. An apparatus for reproducing a charge latent image as claimed in claim 2 wherein said resonating elements are of bimorph-type.

4. An apparatus for reproducing a charge latent image as claimed in claim 1 wherein said vibrating means is composed of, at least, a piezoelectric resonating element and a leaf spring.

5. An apparatus for reproducing a charge latent image as claimed in claim 4 wherein said resonating element is of bimorph-type.

6. An apparatus for reproducing a charge latent image as claimed in claim 1 wherein said one of the two electrodes being vibrated by said vibrating means is composed of a plurality of stripes extending one direction and facing said recording medium, and said vibrating means vibrating said one of the two electrodes perpendicular to said one direction along the recording medium.

* * * * *